United States Patent
Meares

(10) Patent No.: US 7,110,929 B1
(45) Date of Patent: Sep. 19, 2006

(54) SYSTEM AND METHOD OF PROVIDING ADDITIONAL CIRCUIT ANALYSIS USING SIMULATION TEMPLATES

(75) Inventor: Lawrence G. Meares, Rancho Palos Verdes, CA (US)

(73) Assignee: Intusoft, San Pedro, CA (US)

( * ) Notice: Subject to any disclaimer, the term of this patent is extended or adjusted under 35 U.S.C. 154(b) by 0 days.

(21) Appl. No.: 09/438,856

(22) Filed: Nov. 12, 1999

(51) Int. Cl.
*G06F 17/50* (2006.01)

(52) U.S. Cl. .............................. 703/14; 703/13; 716/3
(58) Field of Classification Search .............. 703/14, 703/13; 345/22; 716/3
See application file for complete search history.

(56) References Cited

U.S. PATENT DOCUMENTS

| | | | |
|---|---|---|---|
| 4,656,603 A | | 4/1987 | Dunn |
| 4,675,832 A | | 6/1987 | Robinson et al. |
| 4,813,013 A | | 3/1989 | Dunn |
| 4,829,446 A | | 5/1989 | Draney |
| 4,878,179 A | | 10/1989 | Larsen et al. |
| 4,965,741 A | | 10/1990 | Winchell et al. |
| 5,019,992 A | | 5/1991 | Brown et al. |
| 5,111,413 A | | 5/1992 | Lazansky et al. |
| 5,164,911 A | | 11/1992 | Juran et al. |
| 5,278,769 A | | 1/1994 | Bair et al. |
| 5,297,066 A | * | 3/1994 | Mayes ..................... 703/14 |
| 5,325,309 A | | 6/1994 | Halaviati et al. |
| 5,446,676 A | * | 8/1995 | Huang et al. ............... 703/19 |
| 5,463,563 A | | 10/1995 | Bair et al. |
| 5,471,399 A | | 11/1995 | Tanaka et al. |
| 5,544,067 A | | 8/1996 | Rostoker et al. |
| 5,623,418 A | | 4/1997 | Rostoker et al. |
| 5,629,857 A | | 5/1997 | Brennan |
| 5,721,959 A | | 2/1998 | Nakamura et al. |
| 5,787,268 A | | 7/1998 | Sugiyama et al. |
| 5,798,938 A | * | 8/1998 | Heikes et al. ............... 716/6 |
| 5,801,958 A | | 9/1998 | Dangelo et al. |
| 5,838,947 A | * | 11/1998 | Sarin ...................... 703/14 |

(Continued)

OTHER PUBLICATIONS

Handbook of Mathematical Sciences 5th Edition, by William H. Beyer, CRC Press, ISBN 0-8493-0655-8, 1978, p. 726 Mean Deviation, and p. 727 Standard Deviation, and p. 727 Root Mean Square.*

(Continued)

*Primary Examiner*—Anthony Knight
*Assistant Examiner*—Dwin M. Craig
(74) *Attorney, Agent, or Firm*—Blakely Sokoloff Taylor & Zafman, LLP

(57) ABSTRACT

A simulation template and method therefor is disclosed that modifies a SPICE netlist that describes a circuit in order to provide customized or pre-installed additional analysis. More specifically, a simulation template is an interactive command language (ICL) script that has embedded instructions telling a netlist where to insert information and which options are to be provided. It is used to expand SPICE beyond the traditional limitations of the basic alternating current (AC), direct current (DC), and transient analysis by allowing parameter variations and multiple simulations passes to be run under one analysis umbrella. Such additional analysis employing parameter variations and multiple analysis passes include sensitivity analysis, root means square (RSS) analysis, extreme value analysis (EVA) and worst case sensitivity (WCS), to name a few. The simulation template includes a routine to add to a netlist for altering circuit parameter values of the circuit design in a pre-determined manner, a routine to add to the netlist for performing simulations of the circuit design for respective altered circuit parameter values to arrive at respective selected vector measurements, and a routine to add to the netlist for manipulating at least one of the vector measurements in accordance with the pre-determined analysis.

44 Claims, 25 Drawing Sheets

U.S. PATENT DOCUMENTS

| | | | |
|---|---|---|---|
| 5,889,677 A | | 3/1999 | Yasuda et al. |
| 5,978,476 A | | 11/1999 | Redman et al. |
| 5,982,899 A | | 11/1999 | Probst |
| 6,601,024 B1 * | | 7/2003 | Chonnad et al. .............. 703/14 |
| 6,842,727 B1 * | | 1/2005 | Hayashi ...................... 703/18 |

OTHER PUBLICATIONS

The Computer Science and Engineering Handbook, by Allen B. Tucker, Jr., CRC Press, ISBN 0-8493-2909-4, 1996, p. 862-863 sensitivity analysis, and p. 2348 simulation models.*

Table of Component Failure Modes, Items 1-33.*

Goodall, S. Analog/Mixed Signal Fault Diagnosis Algorithm and Tool Review, AutoTestCon Proceedings 1994,m 351-359, USA.

Simpson, W.R. and Sheppard, J.W., Fault Isolation in an Integrated Diagnostic Environment. IEEE Design & Test, Mar. 1993, 52-66, vol. 10, No. 1, USA.

Pan, C.Y. and Cheng, K.T., Test Generation For Linear, Time Invariant Analog Circuits 3rd IEEE Intl. Mixed-Signal Testing Workshop, Jun. 3-6, 1997, 98-100, USA.

Dill, H., A Comparison of Conventional and Inference Model Based TPS Development Processes, AutoTestCon, 1995, 160-168, USA.

Dill, H., Bratton, K., Sparr, C., and Pitzen, L., Application of Analog & Mixed Signal Simulation Techniques to the Synthesis and Sequencing of Diagnostic Tests.

UL Standards-On-Diskette User Guide, Underwriters Laboratories, Inc., ISBN 0-7629-0093-8, 1996, 17, USA.

Nagel, L.W. and Pederson, DO. Spice 2: A Computer Program to Simulate Semiconductor Circuits, ERL Memo No. ERL-M520, University of California, Berkeley, May 9, 1975.

Johnson, B., Quarles, T., Newton, AR., Pdeerson, DO., Sangiovanni-Vincentelli, A. Spice 3 Version 3f User's Manual, University of CA, Berkeley Oct. 1992.

IsSpice4 User's Guide, Intusoft, 1997, USA, Only 3 Pages Submitted (Bibliographic Data).

Cox., F., Kuhn, W., Murray, J., and Tynor, S., Code-Level Modeling in XSPICE, Proceedings of the 1992 Intl. Syp. of Circuits and Systems, May 1992, USA.

XSPICE User's Manual, Georgis Institue of Research, Georgia Institute of Technology, 1992, USA.

Hamida, NB., Saab, K., Marche, D., Kaminska, B., and Quesnel, G., LIMSoft: Automated Tool for Design and Test Integration of Analog Circuits, 2nd IEEE International.

Sandler, S., SMPS Simulation with SPICE, 1997, McGraw-Hill, USA, Only 3 Pages Submitted (Biblio Data).

Dill, H. Bratton, K., Sparr, C., and Pitzen, L., Application of Analog & Mixed Signal Simulation Techniques to the Synthesis and Sequencing of Diagnostic Tests.

Hamida, NB., Saab, K., Marche, D., Kaminska, B., and Quesnel, G., LIMSoft: Automated Tool for Design and Test Integration of Analog Circuits, 2nd IEEE International Test Conference, pp. 571-580, 1996, Canada.

Slamani, M., Kaminska, B., Analog Circuit Fault Diagnosis Based on Sensitivity Computation and Functional Testing, IEEE Design and Test of Computers, pp. 30-39, Mar. 1992.

Steven M. Sandler, "SMPS Simulation With Spice," McGraw Hill, 1997, (entire book) pp. 1-187.

Lawrence G. Meares, Charles E. Hymowitz, "Simulating With Spice," Intusoft, San Pedro, CA, 1988, (entire book) pp. 1-1 through 6-22 including appendix and index.

ICAP/4 IsSpice4 User's Guide, Version 8.1.0, Intusoft, 1988-1997, entire book, pp. 1-416.

* cited by examiner

SENS, sensitivity analysis Simulation Template With Comments:

*Instruct the netlist builder to show tolerances — 402
tolerance

*Suppress automatic vector saves — 404
nosave

*Suppress IsSpice4 printout — 406
noprint

*Save vectors needed for measurements — 408
vector

*Set the output file pointer to the beginning to remove
* the input net list — 410
set rewind

*Set the noecho environment for print formatting — 412
set noecho

*Run the specified simulation and save the results
simulation
set printmode = save — 414
mprint

*Rename the simulation plot — 416
nameplot ref

*Set the print format
SET COLWIDTH=22 — 418
SET SPICEDIGITS=5

*Tell the user where we are
printstatus -t ########_sensitivity_for_each_parameter_######## — 420

*Loop through all of the parameters
nextparam null
while param <> null
  *Alter each parameter
  alterparam tolerance(param)/3
  *Simulate
  #simulation — 422
  Save the parameter reference in the new plot
  paramvec = param
  *Tell the user where we are
  printstatus -p paramvec
  *Save the data

```
#mprint
*Loop through the vectors
nv = nextvector(null)
while nv <> null
    *Save the sensitivities of scalar data
    if length(nv) = 1
      nv = nv - ref.nv
    end; end if
    *Get the next vector
    nv = nextvector(nv)
end ; end vector loop
*Restore the parameter
unalterparam
*Get the next parameter
nextparam
end; end parameter loop                          ⎯ 422
*Set print mode for printing output data
set printmode = print
unset noecho
*Loop through the plots
pl = nextplot(null)
while pl <> null
  if sameplot(ref.default) = 0
    *Loop through the vectors
    nv = nextvector(null)
    while nv <> null
      if length(nv) = 1
        *Save the sensitivities
        if ref.nv <> 0
          nv = (300*NV)/REF.NV
        else
          nv = 3*NV
        end ; end if
      end ; end if
      nv = nextvector(nv)
    end ; end vector loop
  end; end if
  *Get next plot
  pl = nextplot(pl)
end ; end plot loop                              ⎯ 424
*Tell the user what's going on
printstatus -t ########sorting_sensitivity_for_each_parameter_##
printstatus -t
*Make ref the current plot
setplot ref                                      ⎯ 426
*Sort by descending value
sort -vd
```

FIG. 4-2

```
*Loop through the plots
pl = nextplot(null)
while pl <> null
  if sameplot(ref.default) = 0
    *Print Headers
    SETPARAM PARAMVEC
    printstatus -p paramvec
    ECHO
    ECHO -u "*********SENSITIVITY DATA*********"
    ECHO
    ECHO -un "PARAMETER NAME: "
    PRINTNAME PARAMVEC
    ECHO
    ECHO -un " NOMINAL VALUE: "
    PRINTVAL PARAMVEC
    ECHO
    ECHO
    PRINTTEXT -u VECTOR SENSITIVITY%
    ECHO
    ECHO
    *Sort by descending data value
    sort -vd
    *Loop through the vectors and print data
    nv = nextvector(null)
    while nv <> null
      if length(nv) = 1
        if ref.nv <> 0
          PRINTNAME NV
          PRINTVAL NV
        else
          PRINTNAME NV
          PRINTVAL NV
          ECHO -n *
        end ; end if
        ECHO
      end ; end if
      *Get next vector
      nv = nextvector(nv)
    end; end vector loop
  end ; end if
  *Get next plot
  pl = nextplot(pl)
end; end plot loop
```
⎱— 428

```
ECHO
ECHO
*Print data in output file for SpiceNet to read
setplot ref
echo ########## SENSITIVITY analysis Results ############
#mprint
```
⎱— 430

FIG. 4-3

```
C:\spice8d\Circuits\Bandpass.cir Setup1
*#save V(2) V(3) @C3[i] @C3[p] V(1) @R1[i] @R1[p] V(4)
*#save @C4[i] @C4[p] @R2[i] @R2[p] @R5[i] @R5[p] V(6) V(5)
*#save @V1[i] @V1[p] @V2[i] @V2[p] @V3[i] @V3[p]
```
— 502

```
*#alias v_4 v(4)
*#view tran v_4
```
— 504

```
.TRAN .05ms 20ms
.PRINT AC VDB(4)
.OPTIONS vscale=4
.PRINT TRAN V 4
```
— 506

```
C3 2 3 10N
R1 1 2 10K
C4 2 4 10N
R2 2 0 1MEG
R5 3 4 500K
X1 0 3 6 5 4 LM324M { }
.SUBCKT LM324M 1 2 3 4 5
*
C1   11 12 3.000E-12
C2    6  7 6.000E-12
CEE  10 99 315.8E-15
DC    5 53 DX
DE   54  5 DX
DLP  90 91 DX
DLN  92 90 DX
DP    4  3 DX
EGND 99  0 POLY(2) 3 0  4 0  0 .5 .5
FB    7 99 POLY(5) VB VC VE VLP VLN 0 53.05E6
+ -50E6 50E6 50E6 -50E6
GA    6  0 11 12 37.70E-6
GCM   0  6 10 99 11.92E-9
IEE   3 10 DC 2.476E-6
HLIM 90  0 VLIM 1K
Q1   11  2 13 QX
Q2   12  1 14 QX
R2    6  9 100.0E3
RC1   4 11 26.53E3
RC2   4 12 26.53E3
RE1  13 10 4.820E3
RE2  14 10 4.820E3
REE  10 99 80.78E6
RO1   8  5 50
RO2   7 99 50
RP    3  4 34.71E3
VB    9  0 DC 0
VC    3 53 DC 2
VE   54  4 DC 5.000E-3
VLIM  7  8 DC 0
VLP  91  0 DC 40
VLN   0 92 DC 40
.MODEL DX D(IS=800.0E-18)
.MODEL QX PNP(IS=800.0E-18 BF=31.58)
.ENDS
V1 1 0 AC=1 PULSE 0 -1 1MS
V2 5 0 DC=-5
V3 6 0 DC=5
.END
```
FIG. 5B-2
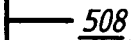 500B
508

C:\spice8d\Circuits\Bandpass.cir Setup1
.OPTIONS vscale=4
.control
alias v_4 v(4)
view tran v_4
save v(4) ——— 608

FIG. 6-1

~ 600 set rewind ——— 610
set noecho ——— 612
TRAN .05ms 20ms set printmode = save
echo TRAN Analysis Measurements
echo
echo Test 1 Mean
homeCursors
print Mean(V(4))
} 614 nameplot ref ——— 616

SET COLWIDTH=22
SET SPICEDIGITS=5
} 618 printstatus -t ########_sensitivity_for_each_parameter_######## ——— 620
nextparam null
while param <> null
    alterparam tolerance(param)/3
    TRAN .05ms 20ms paramvec = param
    printstatus -p paramvec
    echo TRAN Analysis Measurements
echo
echo Test 1 Mean
homeCursors
print Mean(V(4))

nv = nextvector(null)
    while nv <> null
    if length(nv) = 1
        nv = nv - ref.nv
        end
    nv = nextvector(nv)
    end
    unalterparam
    nextparam
end
} 622

```
set printmode = print
unset noecho pl = nextplot(null)
while pl <> null
   if sameplot(ref.default) = 0 nv = nextvector(null)

while nv <> null
          if length(nv) = 1
              if ref.nv <> 0
                  nv = (300*NV)/REF.NV
              else
                  nv = 3*NV
              end
          end
          nv = nextvector(nv)
      end
   end
   pl = nextplot(pl)
end
```
— 624

*FIG. 6-2*

```
printstatus -t ########sorting_sensitivity_for_each_parameter_########
printstatus -t setplot ref
sort -vd
```
— 626

```
pl = nextplot(null)
while pl <> null
   if sameplot(ref.default) = 0

SETPARAM PARAMVEC printstatus -p paramvec

ECHO
      ECHO -u "**********SENSITIVITY DATA**********"
      ECHO
      ECHO -un "PARAMETER NAME: "
      PRINTNAME PARAMVEC
      ECHO
      ECHO -un " NOMINAL VALUE: "
      PRINTVAL PARAMVEC
      ECHO
      ECHO
```
— 628

```
                PRINTTEXT -u VECTOR SENSITIVITY%
                ECHO
                ECHO sort -vd
                nv = nextvector(null)

while nv <> null
                    if length(nv) = 1
                        if ref.nv <> 0
                            PRINTNAME NV
                            PRINTVAL NV
                        else
                            PRINTNAME NV
                            PRINTVAL NV
                            ECHO -n *
                        end
                        ECHO
                    end
                    nv = nextvector(nv)
                end end
            pl = nextplot(pl)
        end
```
— 628

```
ECHO
ECHO setplot ref
echo ########## SENSITIVITY analysis Results #############
echo TRAN Analysis Measurements
echo
echo Test 1 Mean
homeCursors
print Mean(V(4))
```
— 630

```
.endc
C3 2 3 10N TOL=5%
R1 1 2 10K TOL=2%
C4 2 4 10N TOL=5%
R2 2 0 1MEG TOL=2%
R5 3 4 500K TOL=2%
X1 0 3 6 5 4 LM324M { }
```
— 632

*FIG. 6-3*

```
.SUBCKT LM324M 1 2 3 4 5
*
C1   11 12 3.000E-12
C2   6  7 6.000E-12
CEE  10 99 315.8E-15
DC   5 53 DX
DE   54 5 DX
DLP  90 91 DX
DLN  92 90 DX
DP   4 3 DX
EGND 99 0 POLY(2) 3 0  4 0  0 .5 .5
FB   7 99 POLY(5) VB VC VE VLP VLN 0 53.05E6
+ -50E6 50E6 50E6 -50E6
GA   6  0 11 12 37.70E-6
GCM  0  6 10 99 11.92E-9
IEE  3 10 DC 2.476E-6
HLIM 90 0 VLIM 1K
Q1   11 2 13 QX
Q2   12 1 14 QX
R2   6 9 100.0E3
RC1  4 11 26.53E3
RC2  4 12 26.53E3
RE1  13 10 4.820E3
RE2  14 10 4.820E3
REE  10 99 80.78E6
RO1  8 5 50
RO2  7 99 50
RP   3 4 34.71E3
VB   9 0 DC 0
VC   3 53 DC 2
VE   54 4 DC 5.000E-3
VLIM 7 8 DC 0
VLP  91 0 DC 40
VLN  0 92 DC 40
.MODEL DX D(IS=800.0E-18)
.MODEL QX PNP(IS=800.0E-18 BF=31.58)
.ENDS
V1 1 0 AC=1 PULSE 0 -1 1MS
V2 5 0 DC=-5
V3 6 0 DC=5
.END
```

\*\*\*\*\*\*\*\*\*\*SENSITIVITY DATA\*\*\*\*\*\*\*\*\*\*
PARAMETER NAME: r5
NOMINAL VALUE: 500.00K
VECTOR        SENSITIVITY% mean(v(4))    1.5111

\*\*\*\*\*\*\*\*\*\*SENSITIVITY DATA\*\*\*\*\*\*\*\*\*\*
PARAMETER NAME: r2
NOMINAL VALUE: 1.0000Meg
VECTOR        SENSITIVITY% mean(v(4))    17.265M

\*\*\*\*\*\*\*\*\*\*SENSITIVITY DATA\*\*\*\*\*\*\*\*\*\*
PARAMETER NAME: c4
NOMINAL VALUE: 10.0000N
VECTOR        SENSITIVITY% mean(v(4))    -752.77M

\*\*\*\*\*\*\*\*\*\*SENSITIVITY DATA\*\*\*\*\*\*\*\*\*\*
PARAMETER NAME: r1
NOMINAL VALUE: 10.0000K
VECTOR        SENSITIVITY% mean(v(4))    -571.46M

\*\*\*\*\*\*\*\*\*\*SENSITIVITY DATA\*\*\*\*\*\*\*\*\*\*
PARAMETER NAME: c3
NOMINAL VALUE: 10.0000N
VECTOR        SENSITIVITY% mean(v(4))    4.5201

##### sensitivity analysis results #############
tran analysis measurements test 1 mean
mean(v(4)) = 2.086052e-001

Total run time: 0.583 seconds.

Total run time: 0.583 seconds.

Memory remaining = 1996210 Kbytes
Memory Used    = 14401 Kbytes

*FIG. 7*

700

RSS, root summed square analysis Simulation Template With Comments:

*Instruct the netlist builder to show tolerances  — 802
tolerance

*Suppress automatic vector saves  — 804
nosave

*Suppress IsSpice4 printout  — 806
noprint

*Save vectors needed for measurements  — 808
vector

*Set the output file pointer to the beginning to remove
* the input net list  — 810
set rewind

*Set the noecho environment for print formatting  — 812
set noecho

*Run the specified simulation and save the results
simulation
set printmode = save  — 814
mprint

*Set the print format
SET COLWIDTH=22  — 818
SET SPICEDIGITS=5

*Rename the simulation plot  — 816
nameplot ref

*Loop through all of the parameters
nextparam null
*Tell the user where we are
printstatus -t "######## sensitivity for each parameter ########"  — 820
while param <> null
  *Alter each parameter
  alterparam tolerance(param)/3
  *Simulate
  #simulation
  *Save the parameter reference in the new plot   — 822
  paramvec = param
  *Tell the user where we are
  printstatus -p paramvec
  *Save the data
  #mprint

```
*Loop through the vectors
nv = nextvector(null)
while nv <> null
    *Save the sensitivities of scalar data
    if length(nv) = 1
        nv = nv - ref.nv
    end ; end if
    *Get the next vector
    nv = nextvector(nv)
end ; end vector loop                           ⎫
*Restore the parameter                          ⎬ 822
unalterparam                                    ⎪
*Get the next parameter                         ⎪
nextparam                                       ⎪
end ; end parameter loop                        ⎭
*Set print mode for printing output data  ⎫
set printmode = print                     ⎬ 824
unset noecho                              ⎭
*Make a new plot for rss data and make it the current plot
newplot rss ref.default ref.default
setplot rss
*Loop through the vectors
nv = nextvector(null)
while nv <> null
    *Initialize the scalar data to zero          ⎫
    IF LENGTH(NV) = 1                            ⎬ 832
        nv = 0                                   ⎪
    END ; end if                                 ⎪
    * Get the next vector                        ⎪
    nv = nextvector(nv)                          ⎪
end ; end vector loop                            ⎭
*Loop through the plots
pl = nextplot(null)
*Tell the user where we are
printstatus -t "######## computing rss for each measurement ########"    ⎬ 826'
while pl <> null
    *Select plots
    if sameplot(rss.default) = 0
        if sameplot(ref.default) = 0
            *Tell the user what we are doing
            printstatus -l pl
            *Make the saved parameter reference, paramvec current
            SETPARAM PARAMVEC                                              ⎬ 828'
            *Get the next vector
            nv = nextvector(null)
            *Print formatted data
            ECHO
```

```
ECHO -U "*********RSS DATA*********"
    ECHO
    ECHO -UN " PARAMETER NAME: "
    PRINTNAME PARAMVEC
    ECHO
    ECHO -UN " NOMINAL VALUE: "
    PRINTVAL PARAMVEC
    ECHO
    ECHO -UN "TOLERANCE VALUE: "
    PRINTTOL PARAMVEC
    ECHO
    ECHO
    PRINTTEXT -UN VECTOR
    PRINTTEXT -U SENSITIVITY% RSS_CONTRIBUTION
    ECHO
    ECHO
    *Loop through vectors
    while nv <> null
        if length(nv) = 1
            IF REF.NV <> 0
                *Calculate the RSS percentage if value is not zero
                PRINTNAME NV
                NEWNV = (300*NV)/REF.NV
                PRINTVAL NEWNV
            ELSE
                *Calculate the RSS if value is not zero
                PRINTNAME NV
                NEWNV = 3*NV
                PRINTVAL NEWNV
                ECHO -N *
            END ;end if
            *Save and print the sum of squares
            rss.nv = rss.nv + nv * nv
            PRINTVAL RSS.NV
            ECHO
        end ;end if
        * Get next vector
        nv = nextvector(nv)
    end ;end vector loop
    * Sort plot by descending value
    sort -vd
  end ;end if
 end ;end if
 * Get next plot
 pl = nextplot(pl)
end ;end plot loop
```

```
*Sort the rss plot by descending value
setplot rss
SORT -VD
*Print Headers
ECHO
ECHO -U "**********RSS HI/LO ANALYSIS RESULTS**********"
ECHO
PRINTTEXT -UN VECTOR
SET COLWIDTH=15
PRINTTEXT -U NOMINAL RSS-VALUE TOLERANCE% HI_VALUE LO_VALUE
ECHO
ECHO
*Make a new plot for results
newplot hirss ref.default ref.default
*Loop through the vectors
nv = nextvector(null)
while nv <> null
    if length(nv) = 1
        *Print formatted data
        SET COLWIDTH=22
            PRINTNAME NV
        SET COLWIDTH=15
        PRINTVAL REF.NV
            NV = 3 * SQRT(ABS(NV))
        PRINTVAL NV
            IF REF.NV <> 0
            NEWNV = (100*NV)/REF.NV
        ELSE
            NEWNV = NV*0
        END
        PRINTVAL NEWNV
            NV = REF.NV + NV
        HI_RSS = REF.NV + NV
        LO_RSS = REF.NV - NV
        PRINTVAL HI_RSS
        PRINTVAL LO_RSS
        ECHO
    end ; end if
    *Get next vector
    nv = nextvector(nv)
end; end vector loop
ECHO
ECHO
*Print data in output file for SpiceNet to read
setplot rss
echo ########## RSS HI analysis Results ############
#mprint
RUSAGE ELAPSED
```

EVA, Extreme Value Analysis Simulation Template With Comments:

*Instruct the netlist builder to show tolerances — 902
tolerance

*Suppress automatic vector saves — 904
nosave

*Suppress IsSpice4 printout — 906
noprint

*Save vectors needed for measurements — 908
vector

Set the noecho environment for print formatting
set rewind —— 910
set noecho —— 912

*Run the specified simulation and save the results
simulation
pltype = 0 ;Identify the plot type for later use — 914'
set printmode = save
mprint

*Set the print format
SET COLWIDTH=22  — 918
SET SPICEDIGITS=5
nameplot ref — 916
newplot evahi ref.default ref.default
evahi.pltype = 0 ;Identify the plot type for later use — 932
*Print status for the user
printstatus -t "######## sensitivity for each parameter ########" — 920
*Loop through the parameters
nextparam null
while param <> null
   *Alter each parameter
   alterparam tolerance(param)/3
   *Simulate, making a new plot for results
   #simulation
   *Save the current parameter reference — 922'
   paramvec = param
   *Tell the user where we are
   printstatus -p paramvec
   *Save the tol and paramval
   paramtol = tolerance(param)
   paramval = getparam(param)
   pltype = 1 ;Identify the plot type for later use
   *Save the simulation results

FIG. 9-1

— 900

```
#mprint
*Loop through all the vectors
nv = nextvector(null)
while nv <> null
    *Save the sensitivities for all scalar measurements except pltype
    if length(nv) = 1
        if nv <> pltype
            nv = nv - ref.nv
        end ;end if
    end ;end if
    nv = nextvector(nv)
end ;end vector loop
*Restore the param
unalterparam
*Get the next param
nextparam
end;end parameter loop
*Make ref the current plot
setplot ref
*Loop through the vectors in ref
nv = nextvector(null)
*Tell the user where we are
printstatus -t "######## measurements ########"
while nv <> null
    if length(nv) = 1
        *Loop through all the plots containing scalar vectors
        pl = nextplot(null)
        while pl <> null
            if pltype = 1
* the inner loop, we are looping through each sensitivity plot looking at the same vector
* we will alter the parameter id'd by paramvec to maximize/minimize the vector
                setparam paramvec
                *Change each parameter to its worst case extreme value
                if nv >= 0
                    alterparam paramtol
                else
                    alterparam -paramtol
                end
            end
            pl = nextplot(pl)
        end
        *Simulate for the extreme case and save the data in a new plot
        #simulation
        #mprint
        pltype = 2 ;Identify the plot type for later use
* if we want sensitivity at the extreme, we need to go through each param
* and change it to be a bit different than it is at the extreme, run a simulation ,
```

```
* and mark it as pltype 3 along with its paramvec, then we can take the diff
* from the pltype = 2 to get the sensitivity at the extreme if the sign at the extreme
* is different than at the nominal, we can report an error or go on to do worst case
* for worst case, we need to reduce the param change by 1/2 and do this over again...
* either continue in this loop or make a wc loop afterward... save the paramvalue
* and tolerance
        evahi.nv = nv
        if nv <> pltype
            *Tell the user where we are
            printstatus -n nv
        end ;endif
    end ;end plot loop
    ;get the next vector
    nv = nextvector(nv)
end ;end vector loop                                            } 934
*Set print mode and print header
set printmode = print
unset noecho
setplot EVAHI
ECHO
ECHO -U "**********EVA PARAMETER LIST**********"
ECHO
PRINTTEXT -UN PARAMETER
PRINTTEXT -U NOMINAL TOLERANCE
ECHO
ECHO
*Loop through the parameters
nextparam null
while param <> null
    *Extract the saved param reference and print its data
    paramvec = param
    PRINTNAME PARAMVEC
    PRINTVAL  PARAMVEC
    PRINTTOL  PARAMVEC
    ECHO
    *get the next param
    nextparam
end ;end param loop                                             } 936
ECHO ;print a blank line
*Make a new plot to hold sorted results
newplot evasort ref.default ref.default
*Make ref the current plot
setplot REF                                                     } 938
*Loop through all vectors in ref
nv = nextvector(null)
while nv <> null
    if length(nv) = 1
```

FIG. 9-3

```
*save the result in evasort as a percent of its value
if ref.nv <> 0
    evasort.nv = ((evahi.nv-ref.nv)*100)/ref.nv
else
    evasort.nv = 0;
end ;end if
end ;end if
*Get the next vector
nv = nextvector(nv)
end ;end vector loop
```
⎫
⎬ 938
⎭

```
*Print some headers
ECHO
ECHO -U "**********EVA-HI RESULTS**********"
ECHO
PRINTTEXT -UN VECTOR
PRINTTEXT -U NOMINAL EVA-HI CHANGE%
ECHO
ECHO
setplot evasort
*Sort evasort by descanting data
sort -VD
*Loop through the vectors
nv = nextvector(null)
while nv <> null
    *If its the correct data in the correct plot, print it
    if length(nv) = 1
        if nv <> pltype
            PRINTNAME NV
            PRINTVAL  REF.NV
            PRINTVAL  EVAHI.NV
            PRINTVAL  EVASORT.NV
            ECHO
        end ; end if
    end ; end if
    *Get the next vector
    nv = nextvector(nv)
end ; end vector loop
ECHO
ECHO
```
⎫
⎬ 940
⎭

```
* now the eva results are in pltype = 2 plots
*Print the results so SpiceNet can read the eva-hi data
set printmode = print
unset noecho
setplot evahi
echo ########## EVA HI analysis Results ############
#mprint
```
⎫
⎬ 930'
⎭

*FIG. 9-4*

WCS, Worst Case by Sensitivity Simulation Template With Comments:

*Instruct the netlist builder to show tolerances — 1002
tolerance

*Suppress automatic vector saves — 1004
nosave

*Suppress IsSpice4 printout — 1006
noprint

*Save vectors needed for measurements — 1008
vector

*Set the output file pointer to the beginning to remove — 1010
* the input net list
set rewind

*Set the noecho environment for print formatting — 1012
set noecho

*Run the specified simulation and save the results — 1014
simulation
set printmode = save
mprint

*Set the print format — 1018
SET COLWIDTH=22
SET SPICEDIGITS=5

*Rename the simulation plot — 1016
nameplot ref

*Make a newplot for results — 1032
newplot result ref.default ref.default

*Set the current plot to ref — 1034
setplot ref

*Print status for the user — 1020
printstatus -t "######## sensitivity for each parameter ########"

*Loop through the parameters
nextparam null
while param <> null
  *Alter each parameter
  alterparam tolerance(param)/3
  *Simulate, making a new plot for results
    #simulation
  *Save the current parameter reference

```
        paramvec = param
    *Inform the user about what's being done
        printstatus -p paramvec
    *Make and save the measurements
    #mprint
    *Loop through the vectors
    nv = nextvector(null)
        while nv <> null
          *Save the sensitivity of scalar quantities
          if length(nv) = 1
              nv = nv - ref.nv
                *Save the worst case -hi value
                result.nv = result.nv + abs(3*nv)
          end ;end if
          nv = nextvector(nv)
        end ;end vector loop
      *restore the parameter value
      unalterparam
      *get the next parameter
      nextparam
end ;end parameter loop
```
— 1022'

```
*Set the print mode to print instead of save
set printmode = print
*Restore the echo mode for printing
unset noecho
*Set result to the current plot
setplot result
*Print the header
ECHO
ECHO -U "**********WCS PARAMETER LIST**********"
ECHO
PRINTTEXT -UN PARAMETER
PRINTTEXT -U NOMINAL TOLERANCE
ECHO
ECHO
*Loop through the parameters
nextparam null
while param <> null
      paramvec = param
          *Print the row
          PRINTNAME PARAMVEC
          PRINTVAL  PARAMVEC
          PRINTTOL  PARAMVEC
      ECHO
      nextparam
end
ECHO
```
— 1036

FIG. 10-2

```
*Make a new plot to hold sorted results
newplot wcsort ref.default ref.default
*Set the current plot to ref
setplot REF
*Loop through its vectors
nv = nextvector(null)
while nv <> null
   *Calculate the wc as a percent change results
   if length(nv) = 1
      if ref.nv <> 0
         wcsort.nv = ((result.nv-ref.nv)*100)/ref.nv
      else
         wcsort.nv = 0;
      end ;end if
   end ;end if
      nv = nextvector(nv)
end ;end vector loop                          ⎦ 1038
*Print headers
ECHO
ECHO -U "**********WCS-HI RESULTS**********"
ECHO
PRINTTEXT -UN VECTOR
PRINTTEXT -U NOMINAL WCS-HI CHANGE%
ECHO
ECHO
;sort wcsort by descending value
setplot wcsort
sort -VD
*Print the ordered list
nv = nextvector(null)
while nv <> null
   if length(nv) = 1
      PRINTNAME NV
      PRINTVAL  REF.NV
      PRINTVAL  RESULT.NV
      PRINTVAL  WCSORT.NV
      ECHO
   end
      nv = nextvector(nv)
end
ECHO
ECHO                                          ⎦ 1040
*Set the current plot to the wc results
setplot result
echo ######### WCS HI analysis Results ############
*Print the measured results in a form that can be read back into SpiceNet
#mprint
*Report the elapsed time in the output file
rusage elapsed                                ⎦ 1030'
```

FIG. 10-3

SYSTEM AND METHOD OF PROVIDING ADDITIONAL CIRCUIT ANALYSIS USING SIMULATION TEMPLATES

FIELD OF THE INVENTION

This invention relates generally to computer aided engineering (CAE), and in particular, to a simulation analysis template used to customize a SPICE-based netlist to provide additional circuit analysis.

BACKGROUND OF THE INVENTION

The cost of designing and producing circuits is expensive. Accordingly, engineers need to ensure that their circuits operate according to their intended design. A number of computer applications have been developed which allow design engineers to simulate their circuits prior to actually incurring the cost of production. Some of these computer-aided engineering applications are based on "SPICE," which was first developed by the University of California at Berkeley and later refined by a number of institutions, including the Georgia Institute of Technology. The SPICE-based applications provide design engineers with the necessary tools to create, test, and simulate circuits on a computer.

A limitation of the SPICE-based application is that it provides a limited number of standard circuit analysis. Such standard analysis includes alternating current (ac) analysis, transient analysis, operating point analysis, direct current (DC) sweep analysis and others. Typically, these analysis are performed using nominal values for the parameters of the circuit design. Accordingly, for a designer to see the effects of parameter tolerance variation, typically the designer changes the parameter value and then runs a simulation. For complicated circuits, manually changing the parameter values is cumbersome and time-consuming, and is typically not practical. Furthermore, designers may also want statistical analysis of the desired circuit measurements based on parameter variations, such as, for example, sensitivity analysis, root summed square analysis, extreme value analysis and worst case analysis, to name of few. Such additional analysis are not available in SPICE-based applications. Other customizable analysis may also be desired which is also not available in SPICE-based applications.

In the prior art, some SPICE-based applications provide a parameter tolerance variations analysis called adjoint matrices. In the adjoint matrices technique, a simulation is performed and a matrices is created which can characterize variations in the output vector measurements by mathematical equations. The mathematical equations model the output vector measurements based on parameter tolerance variations. However, this technique is typically not accurate and not stable. Mainly because the modeling equations do not take into account non-linear response of the circuit components due to parameter tolerance variations. Thus, in addition for a need of additional analysis for SPICE-based applications, there is a need for analysis which provide more accurate and stable simulations when performing a parameter tolerance variation analysis.

Such needs are provided for by the invention described herein.

SUMMARY OF THE INVENTION

The methodology of the invention involves a simulation template which is used to modify a netlist that describes the circuit in order to provide customized or pre-installed analysis beyond the analysis available in standard SPICE. More specifically, a simulation template is an interactive command language (ICL) script that has embedded instructions telling a netlist where to insert information and which options are to be provided. It is used to expand SPICE beyond the traditional limitations of the basic alternating current (AC), direct current (DC), and transient analysis by allowing parameter variations and multiple simulation passes to be run under one analysis umbrella. Such additional analysis employing parameter variations and multiple analysis passes include sensitivity analysis, root summed square (RSS) analysis, extreme value analysis (EVA) and worst case by sensitivity (WCS), to name a few.

One aspect of the invention is a method of modifying a SPICE netlist of a circuit design using a simulation template to perform a pre-determined analysis involving circuit parameter perturbations, comprising the steps of adding a perturbing routine to the netlist for altering circuit parameter values of the circuit design in a pre-determined manner; adding a simulation routine to the netlist for performing simulations of the circuit design for respective altered circuit parameter values to arrive at respective selected vector measurements; and adding an analysis routine to the netlist for manipulating at least one of the vector measurements in accordance with the pre-determined analysis. The method may include additional steps of adding tolerances in the netlist for the circuit parameters, removing parameter and vector save statements in the netlist, and adding a routine to the netlist to perform a reference simulation of the netlist to arrive at a nominal value for the selected vector measurement.

In addition, the pre-determined analysis can take numerous pre-installed forms or can be customized by a user. For instance, the pre-determined analysis may include a sensitivity analysis involving determining a difference between the respective selected vector measurements and the nominal selected vector measurement. The pre-determined analysis may also include a root summed square analysis involving a sum of the square of the difference between the respective selected vector measurements and the nominal selected vector measurement. Additionally, the pre-determined analysis can include an extreme value analysis involving a determination of a maximum of the difference between the respective selected vector measurements and the nominal selected vector measurement when the circuit parameter values are at their extreme tolerance values. Further, the pre-determined analysis can include a worst case by sensitivity analysis involving a maximum of an absolute value of the difference between the respective selected vector measurements and the nominal selected vector measurement.

Another aspect of the invention includes a computer readable medium having stored therein a simulation template for modifying a SPICE netlist of a circuit design to perform a pre-determined analysis involving parameter perturbations, comprising a routine to add to the netlist for altering circuit parameter values of the circuit design in a pre-determined manner; a routine to add to the netlist for performing simulations of the circuit design for respective altered circuit parameter values to arrive at respective selected vector measurements; and a routine to add to the netlist for manipulating at least one of the vector measurements in accordance with the pre-determined analysis. As with the method, other commands (routines) can be included in the simulation template to add tolerances in the netlist for the circuit parameters, to remove parameter and vector save statements in the netlist, and to add a routine to the netlist to perform a reference simulation of the netlist to arrive at a nominal value for the selected vector measurement. The simulation template may include user-customized analysis or pre-installed analysis, such as sensitivity, RSS, EVA and WCS analysis, to name a few.

BRIEF DESCRIPTION OF THE DRAWINGS

FIG. 4 illustrates in more detail a preferred implementation of an ICL script of a simulation template that builds a netlist to perform a sensitivity analysis;

FIG. 6 illustrates a built netlist that has been modified in accordance with the sensitivity simulation template of FIG. 3;

FIG. 7 illustrates an exemplary output file for the sensitivity analysis performed in accordance with the built netlist of FIG. 6;

FIG. 8 illustrates a flow diagram of an exemplary simulation template that builds a netlist that performs a root summed square (RSS) analysis on a proposed circuit design;

FIG. 9 illustrates a flow diagram of an exemplary simulation template that builds a netlist that performs an extreme value analysis (EVA) on a proposed circuit design; and FIG. 10 illustrates a flow diagram of an exemplary simulation template that builds a netlist that performs a worst case by sensitivity (WCS) analysis on a proposed circuit design.

DETAILED DESCRIPTION OF THE PREFERRED EMBODIMENTS

Figure 1A:
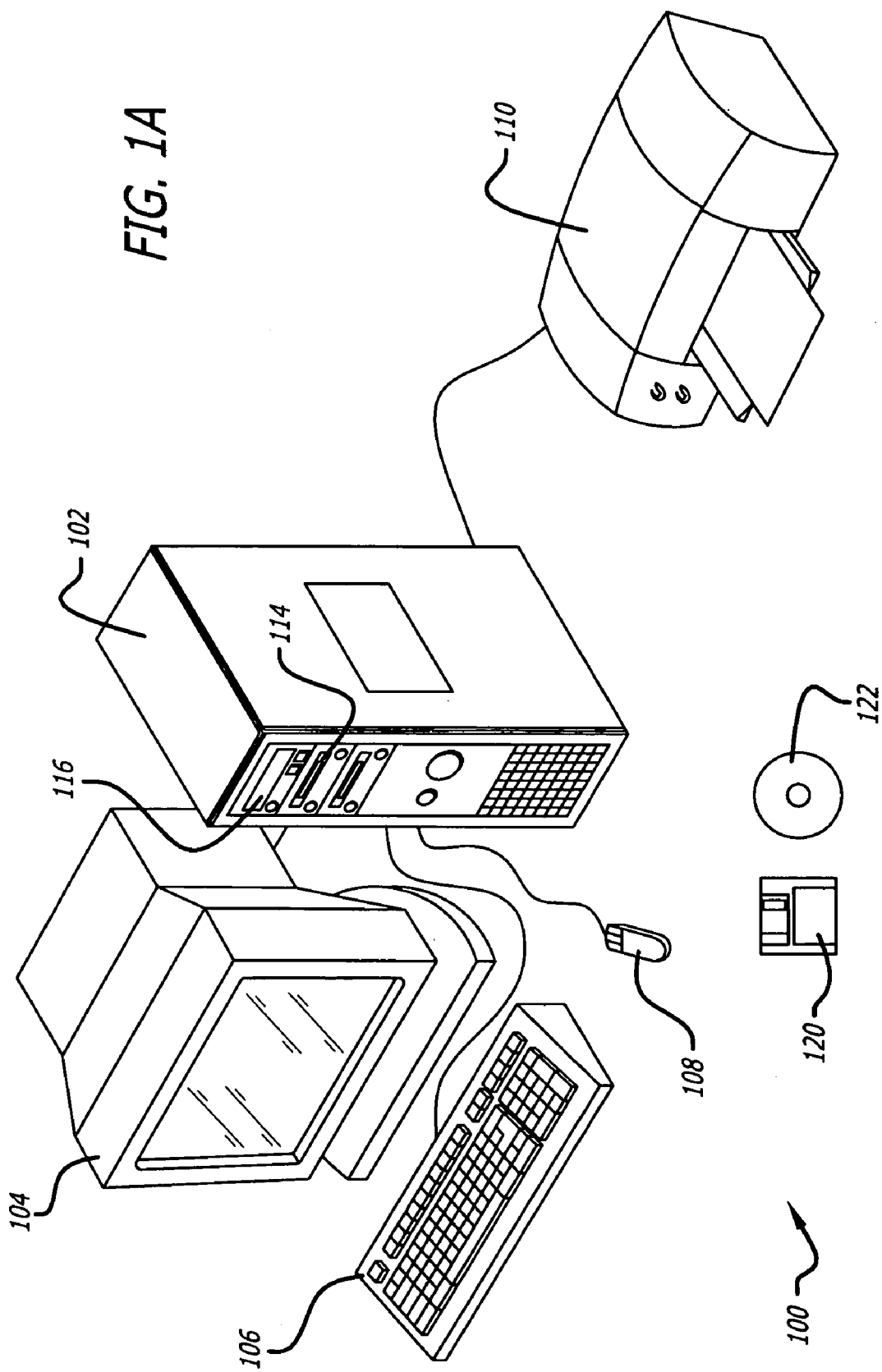
FIG. 1A illustrates an exemplary embodiment of a computer system that can be used for simulation and analysis of circuit designs in accordance with the invention.
Figure 1B:
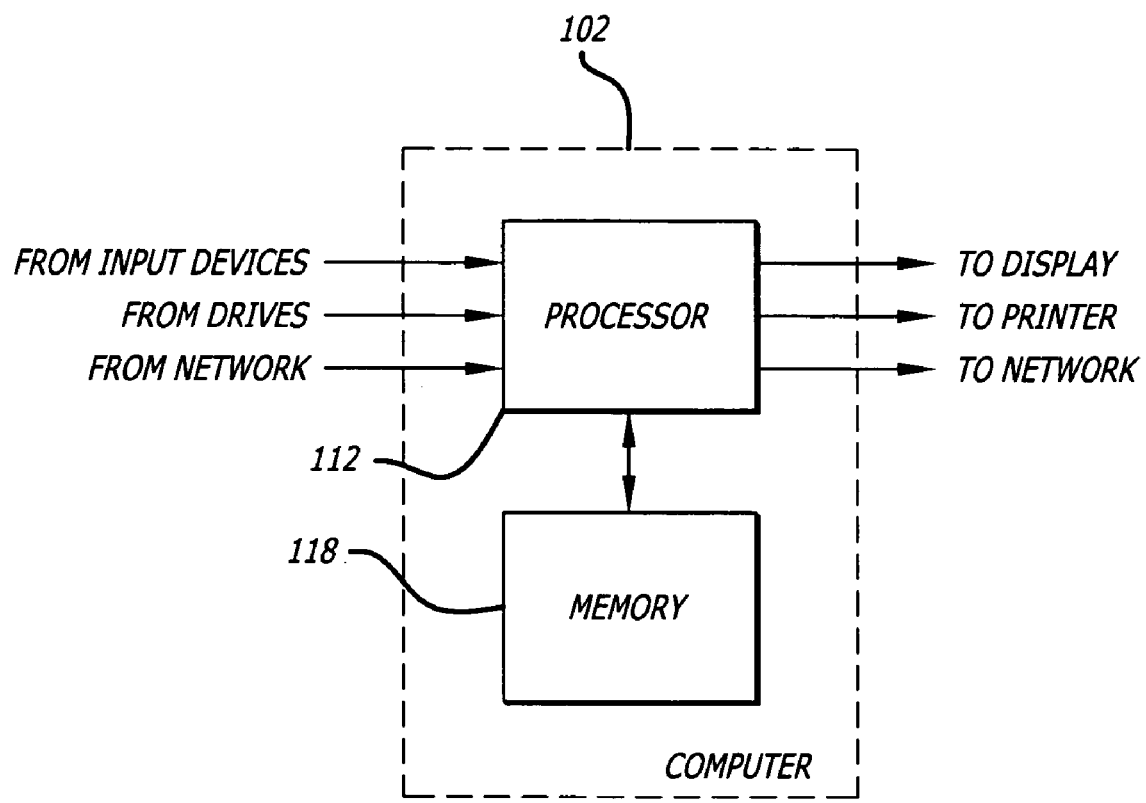
FIG. 1B illustrates an exemplary embodiment of the computer used in a simulation and analysis circuit design computer in accordance with the invention.

FIG. 1A illustrates an exemplary embodiment of a computer system 100 that can be used for simulation and analysis of circuit designs in accordance with the invention. The system 100 preferably comprises a computer 102, a display 104, an input mechanism such as a keyboard 106 and/or a trackball or a mouse 108, and a printer 110. FIG. 1B illustrates an exemplary embodiment of the computer 102 in which a processor 112 receives data from the input devices 106 and/or 108, and provides data to the display 104 and the printer 110. The computer 102 may also include a nonvolatile storage medium for storing the program files for the SPICE-based application and simulation templates described herein, such as a floppy disk drive 114 and/or a CD-ROM drive or hard disk drive 116 in communication with the processor 112. The processor 112 may also be in communication with a computer network via a network interface card (not shown). The computer 102 may include memory 118 connected to the processor 112. The term "processor" as used herein refers to any hardware or circuitry for processing data, for example, a central processing unit (CPU).

The methodology of the invention involves a simulation template which is used to modify a netlist that describes the circuit in order to provide customized or pre-installed additional analysis. More specifically, a simulation template is an interactive command language (ICL) script that has embedded instructions telling a netlist where to insert information and which options are to be provided. It is used to expand SPICE beyond the traditional limitations of the basic alternating current (AC), direct current (DC), and transient analysis by allowing parameter variations and multiple simulations passes to be run under one analysis umbrella. Such additional analysis employing parameter variations and multiple analysis passes include sensitivity analysis, root summed square (RSS) analysis, extreme value analysis (EVA) and worst case by sensitivity (WCS) analysis, to name a few.

Figure 2:
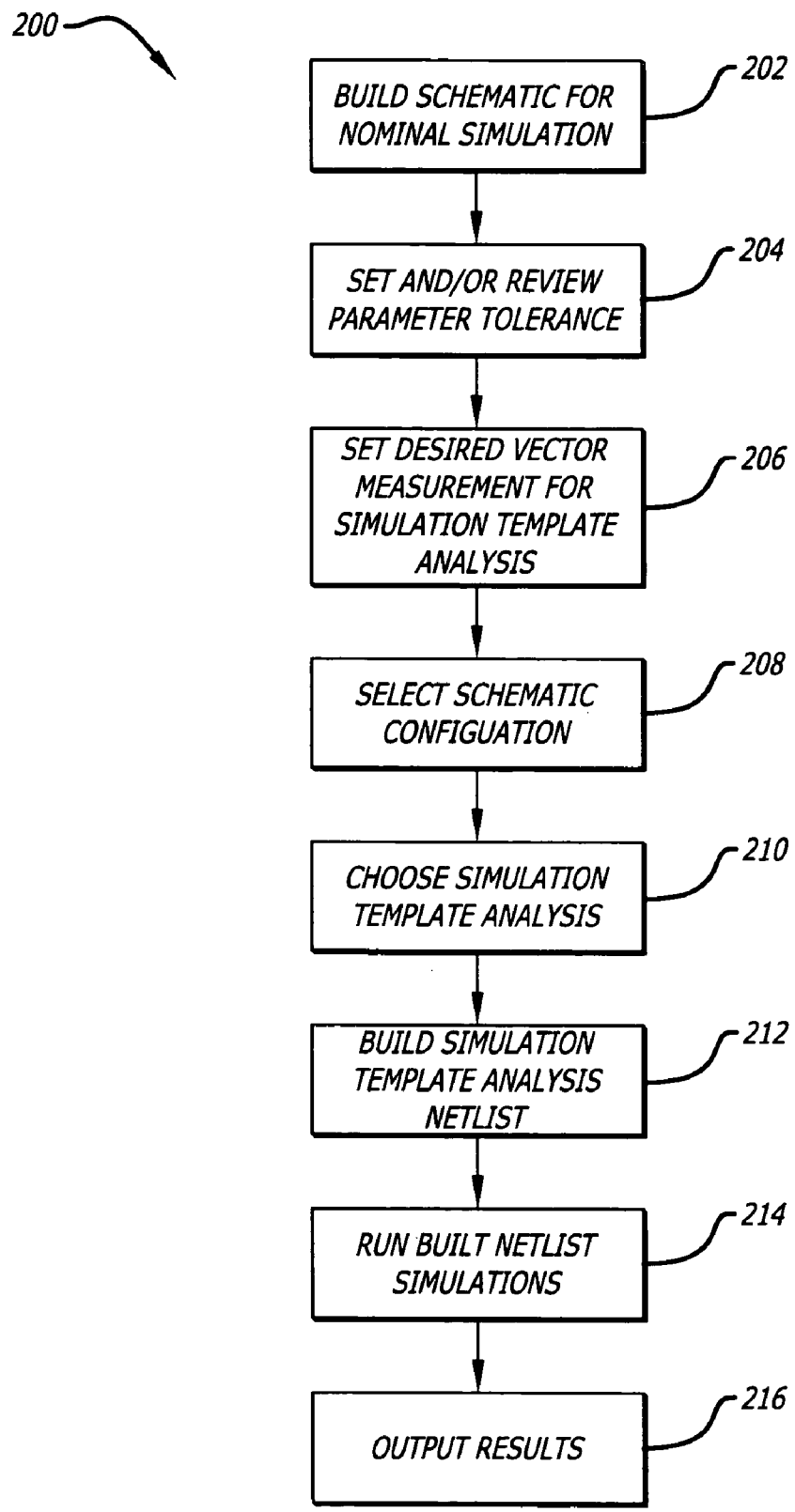
FIG. 2 illustrates a flow diagram of an exemplary method of using a simulation template in accordance with the invention.

FIG. 2 illustrates a flow diagram of an exemplary method 200 of using a simulation template in accordance with the invention in order to provide additional circuit analysis involving parameter variations and multiple simulation passes. In a first step 202, a user builds a schematic using SPICE for a proposed circuit design. This step can be accomplished in many conventional ways, such as graphically or textually. In the next step 204, the user can either set tolerances for the parameters of the proposed circuit design, or if tolerances are already set, the user may want to review them. Then in step 206, the user sets the desired vector measurements for the simulation template analysis. This can be, for example, a voltage at a particular node, a current along a particular branch, and/or the power dissipation across a particular component. Since in the preferred embodiment, the simulation template operates on scalar measurements, in this step the user may specify a scalar type for each of the vector measurements. For example, the user may specify a scalar such as the maximum, minimum, or mean value of the vector measurement, to name a few.

In a next step 208, the user selects the schematic configuration of the proposed circuit. A "configuration" is a unique set of schematic diagrams for the proposed circuit design typically tailored for a specific need. Some configurations may be tailored for production needs, others may be tailored for component needs. Additional configurations can be of a closed loop type, an open loop type, and a safe to start type. These configurations are described in greater detail in co-pending patent application Ser. No. 08/925,121, filed on Sep. 8, 1997, entitled "Methods and Apparatus for Configuring Schematic Diagrams," and now issued as U.S. Pat. No. 6,230,305 which is hereby incorporated by reference for all purposes. Next, in step 210, the user specifies the simulation template analysis to be performed on the proposed circuit design. The simulation template analysis may be pre-installed into the SPICE program or may be uniquely specified by a user. Examples of simulation template analysis include sensitivity analysis, root summed square (RSS) analysis, extreme value analysis (EVA) and worst case sensitivity (WCS) analysis.

Once the user has selected the desired simulation template analysis, in step 212 the ICL script associated with the selected simulation template analysis is executed to build the netlist in order for the desired analysis to be performed. The ICL script has embedded instructions that tells the netlist where to insert information and which options are to be provided. For example, the ICL script may add tolerances to the parameters of the circuit design, the script may also add routines for varying the parameter values within the tolerance limits and perform a simulation based on the altered parameter values, and/or the script may also add routines to perform different analysis of the simulations, such as perform a sensitivity, RSS, EVA and/or WCS analysis. Once the netlist is built, in step 214 the netlist is executed to perform the analysis in accordance with the simulation template. Then in step 216, the results may be outputted to the display 104 for the user to view.

Figure 3:
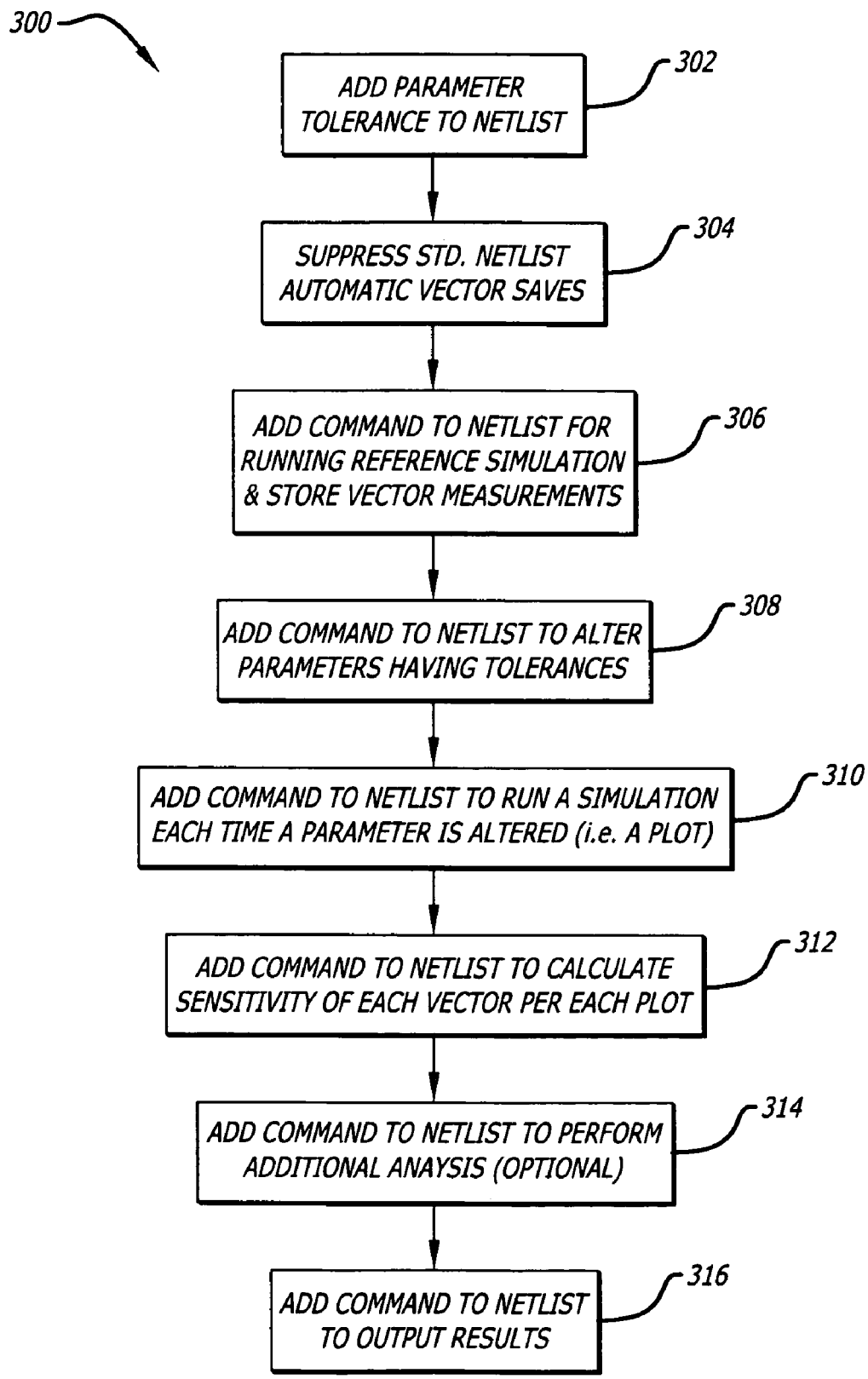
FIG. 3 illustrates a flow diagram of an exemplary simulation template used to build a netlist that performs a sensitivity analysis on a proposed circuit design.

FIG. 3 illustrates a flow diagram of a simulation template 300 used to build a netlist that performs a sensitivity analysis on the proposed circuit design. In step 302, the simulation template 300 includes a directive command that adds tolerances to the circuit parameters. Parameter tolerances is typically not present in the netlist prior to running the simulation template. Rather, only nominal values for the parameters are specified in the netlist. Parameter tolerances are used by the simulation template analysis to vary the parameter values within their respective tolerance limits. In step 304, the simulation template 304 provides a directive command that suppresses the automatic parameter and vector saves that occur each time a normal netlist simulation is run. The purpose of step 304 is to save memory space since a vector measurement may comprise large amounts of data, which would require a substantial memory size if numerous simulations are performed in the simulation template analysis.

The next step 306 in the simulation template 300 is to include a command (routine) in the netlist that runs a reference simulation and stores the scalar values of the desired vector measurements. In the preferred embodiment, the reference simulation is merely a simulation with the parameter values at their nominal values. Next, the simulation template 300 adds a command (routine) 308 to the netlist to vary each parameter value, preferably one parameter value at a time. The parameter values may be varied in numerous ways, such as varying the parameter value according to a pre-specified standard deviation. In step 310, the simulation template 300 adds a command (routine) to the netlist to run a simulation each time a parameter is varied and to store the scalar values of the desired vector measurements. Typically steps 308 and 310 are set within a program loop to cause the program to successively vary each of the parameters and to perform a simulation each time a parameter is varied. Each time a parameter is varied and a simulation occurs which results in at least one vector measurement is termed herein as a "plot."

In step 312, the simulation template 300 adds a command (routine) to the netlist to calculate the sensitivity of each of the vector measurements for each plot. The sensitivity is the vector measurement calculated when a parameter value is varied from nominal minus the vector measurement when the parameter value is nominal. The sensitivity measurement is typically set within a loop to successively calculate the sensitivity for the desired vector measurements chosen. If additional analysis beyond sensitivity, such as performing an RSS, EVA and/or WCS analysis, is desired, in step 314, the simulation template 300 adds additional command (routines) to the netlist for performing the selected additional analysis. Then in step 316, the simulation template 316 adds a command (routine) to the netlist to output the results to the display 104, the printer 110, and/or a file. The user can now review the results of the sensitivity analysis or other analysis specified in the simulation template.

FIG. 4 illustrates in more detail a preferred implementation of an ICL script of a simulation template 400 that builds a netlist to perform a sensitivity analysis. In step 402, the simulation template 400 includes a "#tolerance" directive that adds tolerances to the parameters in the netlist that have tolerances associated with them. In step 404, the simulation template 400 includes a "#nosave" directive that suppresses the normal parameter and vector saves that occurs when a simulation is run. The purpose of step 404 is to reduce memory required to perform the simulation template analysis, since an individual vector may comprise many data, and thus saving them each time a simulation is run would take up lots of memory space. In step 406, the simulation template 400 includes "#noprint" directive to suppress the print statements in the regular netlist, since the simulation template 400 includes its own output printing routine which is customized for the analysis being performed.

In step 408, the simulation template 400 includes a "#vector" directive to cause the netlist to generate save commands for the selected scalar of the selected vector measurements. For example, if the selected scalar of the vector measurement is the mean value for a voltage at node 2 (i.e. V(2)), then the "#vector" directive generates the commands for saving the mean value of V(2). In step 410, the simulation template 400 adds a "set rewind" command to the netlist to set the output file pointer to the beginning to remove the input netlist. A regular simulation of the proposed circuit produces an echo of the netlist in the output file. The "set rewind" removes the input netlist from the output file. In step 412, the simulation template 400 adds a "set noecho" command to the netlist to suppress writing to an output file when a reference simulation is later executed.

Then in step 414, the simulation template 400 adds a "#simulation" directive, a "set printmode=save" command, and a "#mprint" directive to the netlist so that a reference simulation (preferably a simulation using nominal values for the circuit parameters) is run and the resulting scalars of the selected vector measurements are saved. More specifically, the "#simulation" directive causes the simulation of the circuit, the "set printmode=save" command causes the vector measurements to be saved, rather than printed, and the "#mprint" directive creates the print commands for each of the selected vector measurements. In step 416, the simulation template 416 adds a "nameplot ref" command to the netlist to assign the variable "ref" to the simulation plot. In step 418, the simulation template 400 adds some print format commands to the netlist to format the printing of the output results. In step 420, the simulation template 400 adds a "printstatus . . . " command to the netlist so that it outputs a message to the user that sensitivity analysis for each of parameter is being performed.

In step 422, the simulation template 400 adds a series of commands (routine) to the netlist to vary each parameter having tolerances associated with it, to run a simulation each time a parameter is varied and store the scalars of the selected vector measurements (i.e. a plot), and to calculate the sensitivity of the vector measurements each time a parameter is varied. The step 422 comprises an outer loop that selects each of the parameters for variation, and an inner loop that calculates the sensitivity of each of the selected vector measurements for the parameter that is being varied. In step 424, the simulation template 400 adds a series of commands (routine) to the netlist to enable the print commands and to reformat the sensitivity data so that it is more understandable to the user, such as to output the sensitivity in percentage form.

In step 426, the simulation template 400 adds a series of commands (routine) to the netlist to sort the sensitivity data from high to low. In step 428, the simulation template adds a series of commands (routine) to the netlist to output the sensitivity results to the display. Step 428 loops through each of the parameters by adding headers to the output, sorting the sensitivity data in descending order, and looping through the printing of each of the vectors. In step 430, the sensitivity data is printed to an output file.

Figures 1, 5A, 5B:
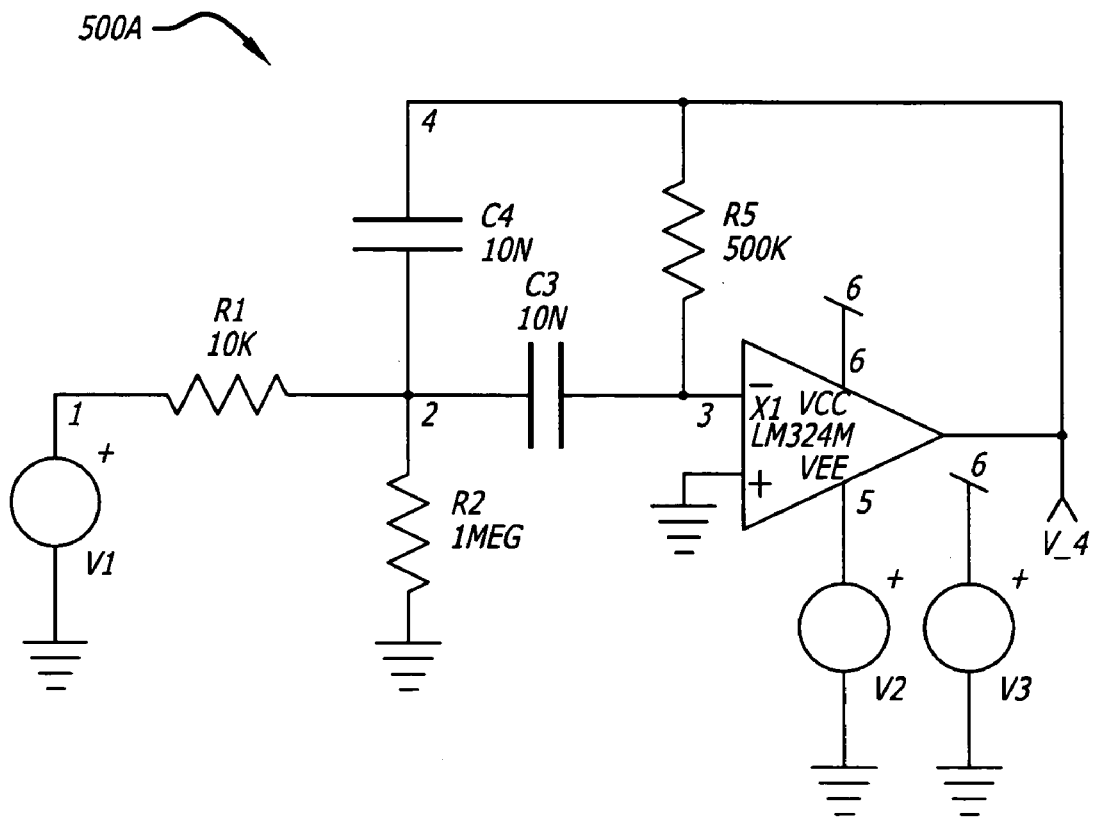
FIG. 5A illustrates an exemplary schematic of a band pass filter used to illustrate how the simulation template modifies the circuit's standard netlist.
FIG. 5B illustrates the standard netlist for the band pass filter shown in FIG. 4.

FIG. 5A illustrates an exemplary schematic of a band pass filter 500A used to illustrate how the simulation template modifies the circuit's standard netlist to provide the sensitivity analysis previously discussed. The band pass filter 500 comprises an operational amplifier LM324, resistors R1, R2 and R5, capacitors C3 and C4, and voltage sources V1, V2 and V3.

FIG. 5B illustrates a standard netlist 500 for the band pass filter 500A shown in FIG. 5A. The standard netlist 500B may include a plurality of "#*save" statements 502 for saving parameter values and vector measurements each time a simulation is run. The standard netlist 500B may also include other standard commands 504 such as "#alias v_4 v(4)" which assigns another name v_4 to variable v(4), and "#view" which causes the graphical representation of the transient of voltage v_4 to be displayed. Other standard SPICE commands and/or options are available to the user, which are known to those skilled in the art. The standard netlist 500 may also include ".command" statements 506 which are used for a variety of functions, such as the ".TRAN 0.05 ms 20 ms" statement which causes a transient analysis to be performed on the proposed circuit design. In addition, the ".PRINT" command causes the specified vector measurements to be displayed. Other dot-commands and/or options are available to the user, which are known to those skilled in the relevant art. The standard netlist 500B finally includes the circuit description section 508 which describes the proposed circuit design.

FIG. 6 illustrates a built netlist 600 that has been modified in accordance with the sensitivity simulation template 400 previously described. As the built netlist 600 illustrates, circuit description section 632 of the band pass filter has been modified to include tolerance information for the listed resistance and capacitance parameters of R1, R2, R5 and C3, C4, respectively. This is the result of the "#tolerance" directive of the sensitivity simulation template 400. Also, in the built netlist 600, the automatic save statements (i.e. *#save) that were present in the standard netlist 500 has been removed by the "#nosave" directive of the simulation template 400. The save vector directive "#vector" adds the statement "save v(4)" 608 to the built netlist 600 to cause the saving of the selected vector measurement, which in this example is the voltage at node 4.

The sensitivity simulation template 400 then adds the rest of the commands (routine) to run the analysis as previously discussed, such as the "set rewind" command 610; the "set noecho" command 612; the commands (routine) 614 for running and executing a reference simulation; the "nameplot ref" command 616 for saving vector measurement in a data structure named "ref"; the "printstatus" command 620 for displaying a message on the display; the commands (routine) 622 for altering the parameter values, running a simulation for each altered parameter (i.e. plot), and for calculating the sensitivity of the vector measurements; the commands (routine) 624 to enable the print commands and to reformat the sensitivity data; the commands (routine) 626 to sort the sensitivity data in descending order; commands (routine) 628 to print the output of the sensitivity results to the display screen; and commands (routine) 630 to print the sensitivity data to an output file.

FIG. 7 illustrates an exemplary output file 700 for the sensitivity analysis performed in accordance with the built netlist 600. For each of the parameters having tolerances, the output file 700 lists the name of the parameter, its nominal value, the scalar (e.g. mean) value of the vector (e.g. v(4)) that is being measured, and the sensitivity in percentage of the selected vector based on the variation of the corresponding parameter. In the example, the sensitivity of mean of voltage v(4) is calculated for variations in parameters of the resistor r5, resistor r2, capacitor c4, resistor r1, and capacitor c3. After the list, the output file 700 includes the nominal value for the selected scalar (e.g. mean v(4)) is outputted along with the ran time, the memory remaining, and the memory used.

FIG. 8 illustrates a flow diagram of an exemplary simulation template 800 that builds a netlist that performs a root summed square (RSS) analysis on a proposed circuit design. In the RSS analysis, after running a reference simulation, each of the parameter having tolerances are perturbed and a simulation is performed each time a vector is perturbed. This results in a number of simulations equal to the number of parameters that have tolerances. Then the sensitivity of each of the measurements is squared and summed together. The square root of the sum is then taken and the results are saved in a plot called "rss." Mathematically, the result for a single measurement is:

$$Vresult=sqrt(\Sigma(Vresult(param)-Vresult(nominal))^2)$$

Since the RSS simulation template 800 is similar to the sensitivity simulation template 400, command(s) (routines) that are the same are identified with the same reference numbers, except that their most significant digit is an "8" instead of a "4." The detail discussion of these commands (routine) is provided above with reference to the sensitivity simulation template. If the commands (routine) are modified slightly, a prime (') is added to the reference numbers.

After adding a sensitivity analysis to the netlist in commands (routine) 822, the RSS simulation template 800 adds commands (routine) 832 to the netlist to create and set active a new plot for the RSS data, and initialize the scalar data for the rss plot to zero. Then, the RSS simulation template 800 adds commands (routine) 826' to the netlist to cause a message that the rss is being computed to be displayed. After this, the RSS simulation template 800 adds commands (routine) 828' to the netlist to print the sensitivity, and calculate and print the rss data for each parameter having tolerances (i.e. plot). The RSS sensitivity template 800 then adds commands (routine) 834 to the netlist to calculate and print high and low values of the RSS data for each parameter having tolerances (i.e. plot).

FIG. 9 illustrates a flow diagram of an exemplary simulation template 900 that builds a netlist that performs an extreme value analysis (EVA) on the proposed circuit design. In the EVA analysis, the parameter values are altered to its extreme value in a manner that maximizes the selected scalar of the desired vector measurement(s). The simulation is then run with those new parameter values that should maximize the scalar measurement value and the result for the measurement is saved in a "evahi" plot. The process is repeated for each measurement and when all the simulations are completed, the measurements are printed to an output file. Since the EVA simulation template 900 is similar to the sensitivity simulation template 400, command(s) (routines) that are the same are identified with the same reference numbers, except that their most significant digit is an "9" instead of a "4." The detail discussion of these commands is provided above with reference to the sensitivity simulation template. If the commands (routine) are modified slightly, a prime (') is added to the reference numbers.

As discussed above, the EVA simulation template 900 adds to the netlist a command (routine) 932 to create a new plot "evahi" to save the EVA data. In the sensitivity analysis commands (routine) 922', the parameter tolerances and parameter values are saved in variables "paramtol" and "paramval." After adding a sensitivity analysis to the netlist in commands (routine) 922', the EVA simulation template 900 adds commands (routine) 934 to the netlist to change the parameter values to either their positive or negative extreme value within their tolerances which maximizes the selected scalar of the desired vector measurements, and stores the data. Then, the EVA simulation template 900 adds commands (routine) 936 to the netlist to print out the parameter name, nominal value, and tolerances, with corresponding headings to the output file. The EVA simulation template 900 then adds commands (routine) 938 to the netlist to calculate the percent change between the extreme value and the nominal value of the selected scalar measurement(s). Next, the EVA simulation template 900 adds commands (routine) 940 to the netlist to print to the output file, the name(s) of the selected scalar measurement, the nominal value(s) of the selected scalar measurement, and the extreme value of the selected scalar measurement(s), and the percent change between the extreme value and the nominal value of the selected scalar measurement(s).

FIG. 10 illustrates a flow diagram of an exemplary simulation template 1000 that builds a netlist that performs a worse case by sensitivity (WCS) analysis on the proposed circuit design. In the WCS analysis, a reference simulation is run and the selected scalar measurement is saved. Then, a sensitivity analysis is performed and the measurements saved. The absolute value of the difference measurements are summed and saved in a plot named "result" and printed to an output file. Since the WCS simulation template 1000 is similar to the sensitivity simulation template 400, commands (routine) that are the same are identified with the same reference numbers, except that their most significant digit is a "10" instead of a "4." The detail discussion of these commands (routine) is provided above with reference to the sensitivity simulation template. If the commands (routine) are modified slightly, a prime (') is added to the reference numbers.

As discussed above, the WCS simulation template 1000 adds to the netlist a command (routine) 1032 to create a new plot "result" to save the WCS data, and a command (routine) 1034 to set the reference plot "ref" current prior to performing the sensitivity analysis. In the sensitivity analysis commands (routine) 1022', the worst case high value of the absolute sensitivity is saved in the "result." After adding the sensitivity analysis to the netlist in commands (routine) 1022', the WCS simulation template 1000 adds commands (routine) 1036 to the netlist to print out the parameter name, nominal value, and tolerances, with corresponding headings to the output file. The WCS simulation template 1000 then adds commands (routine) 1038 to the netlist to calculate the percent change between the worst case value and the nominal value of the selected scalar measurement(s). Next, the WCS simulation template 1000 adds commands (routine) 1040 to the netlist to print to the output file, the name(s) of the selected scalar measurement, the nominal value(s) of the selected scalar measurement, the worse case value of the selected scalar measurement(s), and the percent change between the worst case value and the nominal value of the selected scalar measurement(s).

The sensitivity, RSS, EVA and WCS simulation templates are merely examples of simulation templates that can be used to modify a standard SPICE netlist to perform additional analysis involving parameter perturbations and multiple run analysis. In view of the teachings of this patent applications, those skilled in the art could create numerous simulation templates that can modify netlist to perform different analysis on proposed circuit designs.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

It is claimed:

1. A method of modifying a SPICE netlist of a circuit design using a simulation template to perform a pre-determined analysis involving circuit parameter perturbations, the method comprising:
   adding a first simulation routine to said SPICE netlist to perform a reference simulation of said SPICE netlist to arrive at nominal values for selected vector measurements;
   adding a perturbing routine to said SPICE netlist for altering circuit parameter values of said circuit design in a pre-determined manner;
   adding a second simulation routine to said SPICE netlist for performing simulations of said circuit design for respective altered circuit parameter values to arrive at respective selected vector measurements; and
   adding an analysis routine to said SPICE netlist for manipulating at least one of said selected vector measurements in accordance with said pre-determined analysis.

2. The method of claim 1, further including
   adding tolerances in the SPICE netlist for said circuit parameters.

3. The method of claim 1, further including
   removing parameter and vector save statements in said SPICE netlist.

4. A method of modifying a SPICE netlist of a circuit design using a simulation template to perform a pre-determined analysis involving circuit parameter perturbations, the method comprising:
   adding a first simulation routine to said SPICE netlist to perform a reference simulation of said SPICE netlist to arrive at nominal values for selected vector measurements;
   adding a perturbing routine to said SPICE netlist for altering circuit parameter values of said circuit design in a pre-determined manner;
   adding a second simulation routine to said SPICE netlist for performing simulations of said circuit design for respective altered circuit parameter values to arrive at respective selected vector measurements; and
   adding an analysis routine to said SPICE netlist for manipulating at least one of said selected vector measurements in accordance with said pre-determined analysis, wherein said pre-determined analysis includes
     a sensitivity analysis involving determining a difference between said respective selected vector measurements and said nominal values for said selected vector measurements.

5. A method of modifying a SPICE netlist of a circuit design using a simulation template to perform a pre-determined analysis involving circuit parameter perturbations, comprising:

adding a first simulation routine to said SPICE netlist to perform a reference simulation of said SPICE netlist to arrive at nominal values for selected vector measurements;

adding a perturbing routine to said SPICE netlist for altering circuit parameter values of said circuit design in a pre-determined manner;

adding a second simulation routine to said SPICE netlist for performing simulations of said circuit design for respective altered circuit parameter values to arrive at respective selected vector measurements; and adding an analysis routine to said SPICE netlist for manipulating at least one of said selected vector measurements in accordance with said pre-determined analysis;

wherein said pre-determined analysis includes a sensitivity analysis involving determining a difference between said respective selected vector measurements and said nominal values for said selected vector measurements, and a root summed square analysis involving a sum of the square of said difference between said respective selected vector measurements and said nominal values for said selected vector measurements.

6. The method of claim 4, wherein
said pre-determined analysis further includes
an extreme value analysis involving a determination of a maximum of said difference between said respective selected vector measurements and said nominal values for said selected vector measurements when said circuit parameter values are at their extreme tolerance values.

7. The method of claim 4, wherein
said pre-determined analysis further includes
a worst case by sensitivity analysis involving a maximum of an absolute value of said difference between said respective selected vector measurements and said nominal values for said selected vector measurements.

8. A computer readable medium having stored therein a simulation template for modifying a SPICE netlist of a circuit design to perform a pre-determined analysis involving parameter perturbations, comprising:

a routine to add to said SPICE netlist for performing a reference simulation of said SPICE netlist to arrive at nominal values for selected vector measurements;

a routine to add to said SPICE netlist for altering circuit parameter values of said circuit design in a pre-determined manner;

a routine to add to said SPICE netlist for performing simulations of said circuit design for respective altered circuit parameter values to arrive at respective selected vector measurements; and a routine to add to said SPICE netlist for manipulating at least one of said selected vector measurements in accordance with said pre-determined analysis.

9. The computer readable medium of claim 8, wherein
said simulation template further includes
a command to add tolerances in the SPICE netlist for said circuit parameters.

10. The computer readable medium of claim 8, wherein
said simulation template further includes
a command to remove parameter and vector save statements in said SPICE netlist.

11. A computer readable medium having stored therein a simulation template for modifying a SPICE netlist of a circuit design to perform a pre-determined analysis involving parameter perturbations, comprising:

a routine to add to said SPICE netlist for performing a reference simulation of said SPICE netlist to arrive at nominal values for selected vector measurements;

a routine to add to said SPICE netlist for altering circuit parameter values of said circuit design in a pre-determined manner;

a routine to add to said SPICE netlist for performing simulations of said circuit design for respective altered circuit parameter values to arrive at respective selected vector measurements; and a routine to add to said SPICE netlist for manipulating at least one of said selected vector measurements in accordance with said pre-determined analysis, wherein said pre-determined analysis includes a sensitivity analysis involving determining a difference between said respective selected vector measurements and said nominal values for said selected vector measurements.

12. A computer readable medium having stored therein a simulation template for modifying a SPICE netlist of a circuit design to perform a pre-determined analysis involving parameter perturbations, comprising:

a routine to add to said SPICE netlist for performing a reference simulation of said SPICE netlist to arrive at nominal values for selected vector measurements;

a routine to add to said SPICE netlist for altering circuit parameter values of said circuit design in a pre-determined manner;

a routine to add to said SPICE netlist for performing simulations of said circuit design for respective altered circuit parameter values to arrive at respective selected vector measurements; and a routine to add to said SPICE netlist for manipulating at least one of said selected vector measurements in accordance with said pre-determined analysis;

wherein said pre-determined analysis includes a sensitivity analysis involving determining a difference between said respective selected vector measurements and said nominal values for said selected vector measurements, and a root summed square analysis involving a sum of the square of said difference between said respective selected vector measurements and said nominal value for said selected vector measurements.

13. The computer readable medium of claim 11, wherein
said pre-determined analysis further includes
an extreme value analysis involving a determination of a maximum of said difference between said respective selected vector measurements and said nominal values for said selected vector measurements when said circuit parameter values are at their extreme tolerance values.

14. The computer readable medium of claim 11, wherein
said pre-determined analysis further includes
a worst case by sensitivity analysis involving a maximum of an absolute value of said difference between said respective selected vector measurements and said nominal values for said selected vector measurements.

15. The method of claim 1, wherein
said circuit parameter values of said circuit design are one of resistance of a resistor, capacitance of a capacitor, and inductance of an inductor.

16. The method of claim 1, wherein
said at least one selected vector measurement is voltage at a node of said circuit design.

17. The method of claim 1, wherein
said at least one selected vector measurement is current along a branch of said circuit design.

18. The method of claim 1, wherein
said at least one selected vector measurement is power dissipation in a component of said circuit design.

19. The method of claim 18, wherein
said component of said circuit design is one of a resistor, a capacitor, and an inductor.

20. The method of claim 1, wherein
only one circuit parameter value of said circuit design is altered at a time by the perturbing routine.

21. The computer readable medium of claim 8, wherein
said circuit parameter values of said circuit design are one of resistance of a resistor, capacitance of a capacitor, and inductance of an inductor.

22. The computer readable medium of claim 8, wherein
said at least one selected vector measurement is voltage at a node of said circuit design.

23. The computer readable medium of claim 8, wherein
said at least one selected vector measurement is current along a branch of said circuit design.

24. The computer readable medium of claim 8, wherein
said at least one selected vector measurement is power dissipation in a component of said circuit design.

25. The computer readable medium of claim 24, wherein
said component of said circuit design is one of a resistor, a capacitor, and an inductor.

26. The computer readable medium of claim 8, wherein
only one circuit parameter value of said circuit design is altered at a time by the perturbing routine.

27. A method of analyzing a SPICE netlist of a circuit design, the method comprising:
(a) providing a SPICE netlist of a circuit design;
(b) selecting a selected vector measurement of the circuit design;
(c) simulating the SPICE netlist of the circuit design using nominal circuit parameter values to determine a nominal vector measurement associated with the selected vector measurement;
(d) altering at least one circuit parameter value of a component in the SPICE netlist in a pre-determined manner to generate at least one altered circuit parameter value;
(e) simulating the SPICE netlist of the circuit design with the at least one altered circuit parameter value to determine an altered vector measurement associated with the selected vector measurement;
(f) repeating steps (d) and (e) with the at least one circuit parameter value to generate a plurality of altered circuit parameter values and to determine a plurality of altered vector measurements of the circuit design; and
(g) determining a difference between the plurality of altered vector measurements and the nominal vector measurement to generate a sensitivity in the vector measurement of the circuit design in response to alterations in the at least one circuit parameter value of the component in the SPICE netlist.

28. The method of claim 27, wherein
a simulation template is used to perform steps (b)–(g).

29. The method of claim 27, wherein
the at least one circuit parameter value of the component in the SPICE netlist is altered within a tolerance of the component.

30. The method of claim 27, wherein
the at least one circuit parameter value of a component is one of resistance of a resistor, capacitance of a capacitor, and inductance of an inductor.

31. The method of claim 27, wherein
the vector measurement of the circuit design is one of voltage at a node, current along a branch, and power dissipation in the component.

32. The method of claim 27, wherein
only one circuit parameter value of said circuit design is altered at a time.

33. A method of analyzing a SPICE netlist of a circuit design, the method comprising:
(a) providing a SPICE netlist of a circuit design;
(b) selecting a selected vector measurement of the circuit design;
(c) simulating the SPICE netlist of the circuit design using nominal circuit parameter values to determine a nominal vector measurement associated with the selected vector measurement;
(d) altering at least one circuit parameter value of a component in the SPICE netlist in a pre-determined manner to generate at least one altered circuit parameter value;
(e) simulating the SPICE netlist of the circuit design with the at least one altered circuit parameter value to determine an altered vector measurement associated with the selected vector measurement;
(f) repeating steps (d) and (e) with the at least one circuit parameter value to generate a plurality of altered circuit parameter values and to determine a plurality of altered vector measurements of the circuit design;
(g) determining a difference between the plurality of altered vector measurements and the nominal vector measurement to generate a sensitivity in the vector measurement of the circuit design in response to alterations in the at least one circuit parameter value of the component in the SPICE netlist; and
(h) determining a sum of the differences between the plurality of altered vector measurements and the nominal vector measurement, squaring the sum of the differences, and taking the square root of the squared sum of the differences to determine a root summed square (RSS) for the vector measurement of the circuit design in response to alterations in the at least one circuit parameter value of the component in the SPICE netlist.

34. The method of claim 27, wherein
the at least one circuit parameter value is altered to a maximum value and the SPICE netlist of the circuit design is simulated to determine a first altered vector measurement, and
the at least one circuit parameter value is altered to a minimum value and the SPICE netlist of the circuit design is simulated to determine a second altered vector measurement,
and the method further comprises
determining a maximum of a first absolute value of the first altered vector measurement less the nominal vector measurement and a second absolute value of the second altered vector measurement less the nominal vector measurement to determine an extreme value analysis (EVA) for the vector measurement of the circuit design.

35. The method of claim 27, further comprising:
determining scalar differences between the plurality of altered vector measurements and the nominal vector measurement, taking the absolute value of the scalar differences to generate absolute scalar differences, determining a maximum value of the absolute scalar differences to determine a worst case by sensitivity (WCS) for the selected vector measurement of the circuit design.

36. The method of claim 1, wherein said circuit parameter value of said circuit design is one of impedance, admittance, gain, and trans-impedance of an electronic component.

37. The method of claim 36, wherein said electronic component is an active electronic component.

38. The method of claim 36, wherein said electronic component is a passive electronic component.

39. The computer readable medium of claim 8, wherein said circuit parameter value of said circuit design is one of impedance, admittance, gain, and trans-impedance of an electronic component.

40. The computer readable medium of claim 39, wherein said electronic component is an active electronic component.

41. The computer readable medium of claim 39, wherein said electronic component is a passive electronic component.

42. The method of claim 27, wherein the at least one circuit parameter value of a component is one of impedance, admittance, gain, and trans-impedance of an electronic component.

43. The method of claim 42, wherein the electronic component is an active electronic component.

44. The method of claim 42, wherein the electronic component is a passive electronic component.

* * * * *